US009691887B2

(12) United States Patent
Philippou et al.

(10) Patent No.: US 9,691,887 B2
(45) Date of Patent: Jun. 27, 2017

(54) SEMICONDUCTOR DEVICE WITH VARIABLE RESISTIVE ELEMENT

(71) Applicant: Infineon Technologies AG, Neubiberg (DE)

(72) Inventors: Alexander Philippou, Munich (DE); Christian Jaeger, Munich (DE); Johannes Georg Laven, Taufkirchen (DE); Frank Dieter Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/856,764

(22) Filed: Sep. 17, 2015

(65) Prior Publication Data

US 2016/0087005 A1 Mar. 24, 2016

(30) Foreign Application Priority Data

Sep. 19, 2014 (DE) .................. 10 2014 113 557

(51) Int. Cl.
*H01L 29/739* (2006.01)
*H01L 27/06* (2006.01)
(Continued)

(52) U.S. Cl.
CPC ...... *H01L 29/7397* (2013.01); *H01L 27/0652* (2013.01); *H01L 27/0658* (2013.01); *H01L 27/0772* (2013.01); *H01L 27/24* (2013.01); *H01L 27/2436* (2013.01); *H01L 27/2445* (2013.01); *H01L 29/0649* (2013.01);
(Continued)

(58) Field of Classification Search
CPC ............ H01L 27/2445; H01L 27/0652; H01L 27/0658; H01L 27/0772; H01L 29/7395; H01L 29/7397; H01L 29/0821; H01L 29/0649; H01L 29/0834; H01L 29/7393; H01L 29/66325; H01L 29/66333; H01L 45/145
See application file for complete search history.

(56) References Cited

U.S. PATENT DOCUMENTS 6,605,830 B1 8/2003 Kusunoki
7,132,712 B2 11/2006 Kocon et al.
(Continued)

FOREIGN PATENT DOCUMENTS

DE 102006050338 A1 4/2008
DE 112008001550 T5 4/2010
(Continued)

*Primary Examiner* — Joseph C Nicely
(74) *Attorney, Agent, or Firm* — Murphy, Bilak & Homiller, PLLC

(57) ABSTRACT

A semiconductor device includes a semiconductor body including a drift zone that forms a pn junction with an emitter region. A first load electrode is at a front side of the semiconductor body. A second load electrode is at a rear side of the semiconductor body opposite to the front side. One or more variable resistive elements are electrically connected in a controlled path between the drift zone and one of the first and second load electrodes. The variable resistive elements activate and deactivate electronic elements of the semiconductor device in response to a change of the operational state of the semiconductor device.

20 Claims, 15 Drawing Sheets

(51) Int. Cl.
  *H01L 29/66* (2006.01)
  *H01L 27/07* (2006.01)
  *H01L 27/24* (2006.01)
  *H01L 29/06* (2006.01)
  *H01L 29/08* (2006.01)
  *H01L 29/10* (2006.01)
  *H01L 45/00* (2006.01)
  *H01L 29/36* (2006.01)
  *H01L 29/868* (2006.01)
  *H01L 29/40* (2006.01)

(52) U.S. Cl.
  CPC ...... *H01L 29/0821* (2013.01); *H01L 29/0834* (2013.01); *H01L 29/1095* (2013.01); *H01L 29/36* (2013.01); *H01L 29/66325* (2013.01); *H01L 29/66333* (2013.01); *H01L 29/7393* (2013.01); *H01L 29/7395* (2013.01); *H01L 29/868* (2013.01); *H01L 45/122* (2013.01); *H01L 29/0619* (2013.01); *H01L 29/402* (2013.01); *H01L 29/407* (2013.01); *H01L 45/145* (2013.01)

(56) References Cited

U.S. PATENT DOCUMENTS

| 7,250,639 | B1 | 7/2007 | Suekawa | |
|---|---|---|---|---|
| 8,324,691 | B2 | 12/2012 | Hirose et al. | |
| 8,698,229 | B2 | 4/2014 | Willmeroth et al. | |
| 2011/0024791 | A1 | 2/2011 | Schulze et al. | |
| 2015/0325687 | A1* | 11/2015 | Baburske | H01L 29/0696 257/139 |
| 2015/0325688 | A1* | 11/2015 | Baburske | H01L 29/7393 257/139 |
| 2016/0181496 | A1* | 6/2016 | Kegler | H01L 35/04 257/53 |
| 2017/0040431 | A1* | 2/2017 | Basler | H01L 29/45 |

FOREIGN PATENT DOCUMENTS

DE 102010036743 A1 2/2011
DE 102012209192 A1 12/2012

* cited by examiner

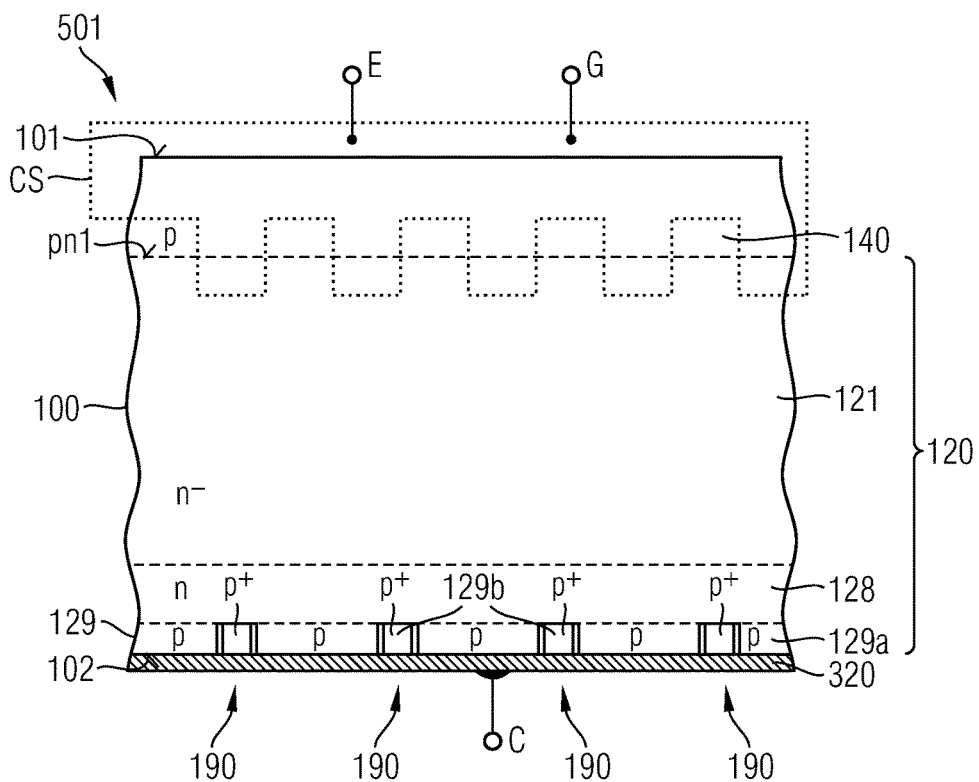
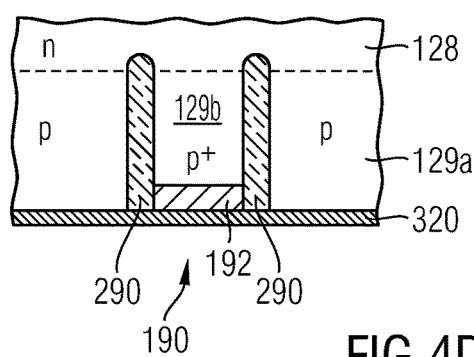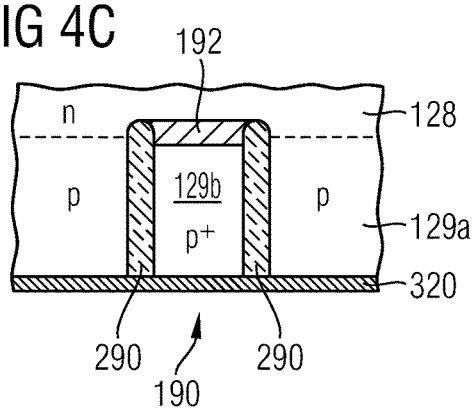
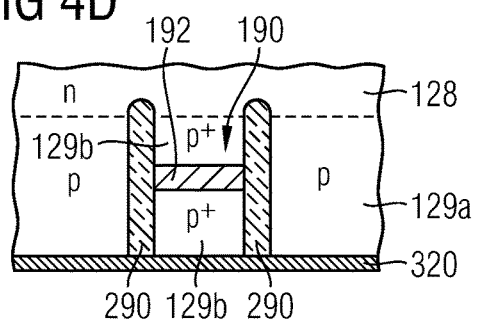

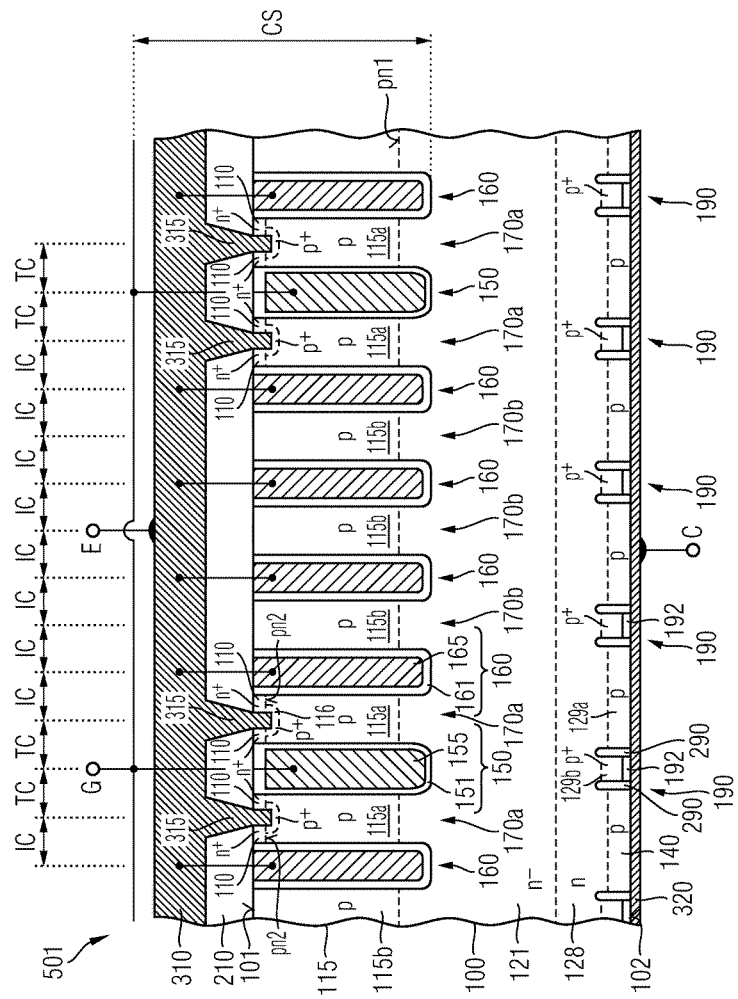

SEMICONDUCTOR DEVICE WITH VARIABLE RESISTIVE ELEMENT

BACKGROUND

Typical specification parameters of power semiconductor devices concern blocking capability, static losses, and switching losses, as well as avalanche and short circuit ruggedness. Improving one of these device characteristics usually adversely affects at least one of the other device characteristics.

It is desirable to provide semiconductor devices with improved specifications.

SUMMARY

According to some embodiments of the presently disclosed invention, a semiconductor device includes a semiconductor body including a drift zone that forms a pn junction with an emitter region. A first load electrode is at a front side of the semiconductor body. A second load electrode is at a rear side of the semiconductor body opposite to the front side. One or more variable resistive elements are electrically connected in a controlled path between the drift zone and one of the first and second load electrodes.

According to other embodiments, an insulated gate bipolar transistor includes a semiconductor body including a drift zone that forms a pn junction with an emitter region. A first load electrode is at a front side of the semiconductor body. A second load electrode is at a rear side of the semiconductor body opposite to the front side. One or more variable resistive elements are electrically connected in a controlled path between the drift zone and one of the first and second load electrodes.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 4A is a schematic cross-sectional view of a portion of an IGBT (insulated gate bipolar transistor) according to an embodiment with a controllable charge carrier emitter based on variable resistive elements connected between a second load electrode and a drift structure including a drift zone.

FIG. 4B shows details of the variable resistive elements of FIG. 4A according to an embodiment concerning an element matrix arranged along the concerned load electrode.

FIG. 4C shows details of the variable resistive elements of FIG. 4A according to an embodiment concerning an element matrix arranged along the drift structure.

FIG. 4D shows details of the variable resistive elements of FIG. 4A according to an embodiment concerning an element matrix spaced from both the concerned load electrode and the drift structure.

FIG. 6A is a schematic vertical cross-sectional view of a portion of an IGBT according to an embodiment concerning controllable charge carrier emitters at a rear side.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" indicates a doping concentration which is lower than the doping concentration of an "n"-doping region, whereas an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
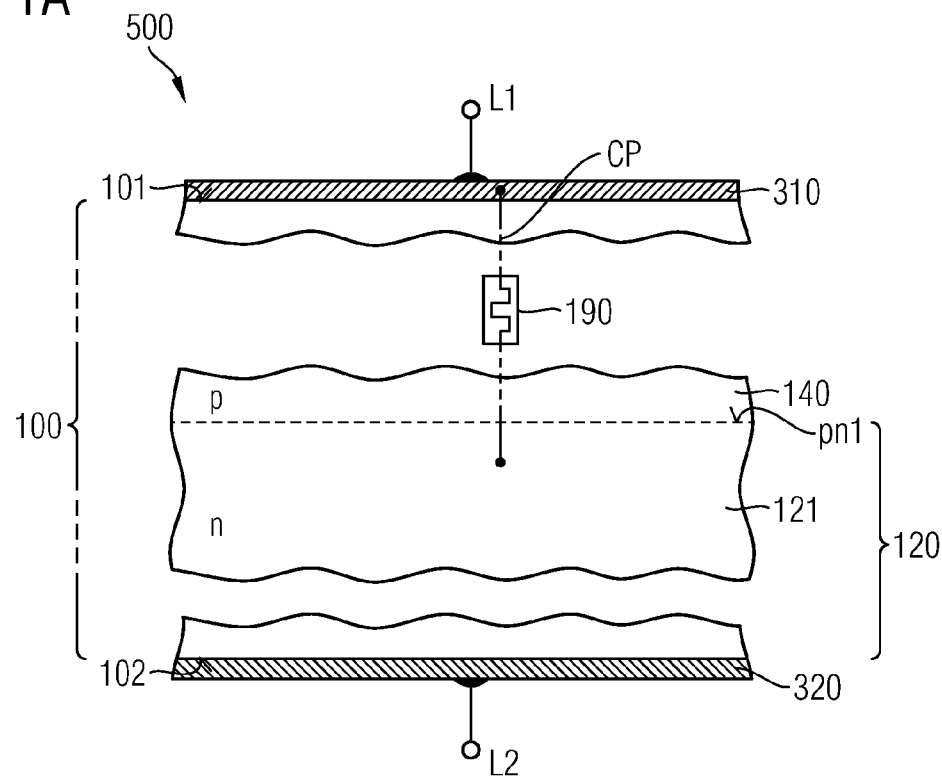
FIG. 1A is a simplified vertical cross-sectional view of a portion of a semiconductor device according to an embodiment concerning a variable resistive element electrically arranged in a controlled path between a first load electrode and a drift zone.
Figure 1B:
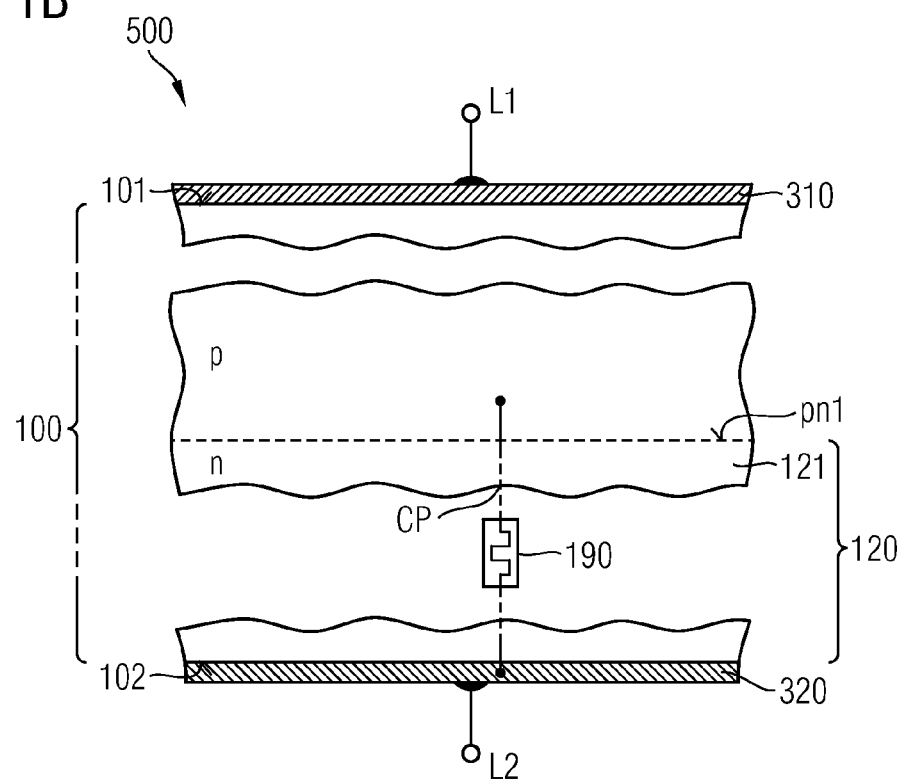
FIG. 1B is a simplified vertical cross-sectional view of a portion of a semiconductor device according to an embodiment concerning a variable resistive element electrically arranged in a controlled path between a drift zone and a second load electrode.

FIGS. 1A to 1B refer to a semiconductor device 500, e.g., a semiconductor switching device including a plurality of identical IGFET (insulated gate field effect transistor) cells. The semiconductor device 500 may be or may include a power semiconductor switching device, for example an IGFET such as a MOSFET (metal oxide semiconductor FET) in the usual meaning including FETs with metal gates as well as FETs with non-metal gates. According to another embodiment, the semiconductor device 500 may be an IGBT (insulated gate bipolar transistor).

The semiconductor device 500 is based on a semiconductor body 100 from a single crystalline semiconductor material such as silicon (Si), silicon carbide (SiC), germanium (Ge), a silicon germanium crystal (SiGe), gallium nitride (GaN), gallium arsenide (GaAs) or any other AIIIBV semiconductor.

The semiconductor body 100 has a first surface 101 which may be approximately planar or which may be defined by a plane spanned by coplanar surface sections. A planar second surface 102 extends parallel to the first surface 101. A distance between the first and second surfaces 101, 102 is a function of a voltage blocking capability of the semiconductor device 500 and may be at least 20 µm. According to other embodiments, the distance may be in the range of several hundred µm.

In a plane parallel to the first surface 101 the semiconductor body 100 may have a rectangular shape with an edge length of several millimeters. A normal to the first surface 101 defines a vertical direction and directions orthogonal to the vertical direction are horizontal directions.

The semiconductor device 500 is a vertical device with a load current flow between a first load electrode 310 directly adjoining the first surface 101 at a front side of the semiconductor device 500 and a second load electrode 320 directly adjoining the opposite second surface 102 at a rear side of the semiconductor device 500.

In the semiconductor body 100, a drift and rear side structure 120 directly adjoins the second surface 102 and is spaced from the first surface 101. The drift and rear side structure 120 includes a drift structure that includes at least a drift zone 121 of a first conductivity type. A mean net dopant concentration in the drift zone 121 may be between $1E12$ $cm^{-3}$ and $1E17$ $cm^{-3}$, for example in a range from $5E12$ $cm^{-3}$ to $5E14$ $cm^{-3}$. The mean net dopant concentration in the drift zone 121 may be uniform or may gradually or in steps increase or decrease with increasing distance to the first surface 101. The drift structure may include further doped regions, e.g., a buffer layer or a field stop layer between the drift zone 121 and the second load electrode 320.

An emitter region 140 of a second conductivity type complementary to the first conductivity type is formed between the first surface 101 and the drift zone 121 and forms a first pn junction pn1 with the drift zone 121. The emitter region 140 may include one contiguous portion formed along the first pn junction pn1 or may be formed by a plurality of spatially separated emitter zones, wherein each emitter zone forms a first pn junction pn1 with the drift zone 121.

A suitable voltage applied between the first load electrode 310 and the second load electrode 320 in a blocking mode of the semiconductor device 500 generates a depletion zone that extends mainly from the first pn junction pn1 into the drift zone 121. The vertical extension of the depletion zone defines the reverse voltage blocking capability of the semiconductor device 500.

The first load electrode 310 may form or may be electrically connected or coupled to a first load terminal L1, which may be the anode terminal of a power semiconductor diode, the source terminal of an IGFET or the emitter terminal of an IGBT, by way of example. The second load electrode 320 may form or may be electrically connected or coupled to a second load terminal L2, which may be the cathode terminal of a power semiconductor diode, a drain terminal of an IGFET or a collector terminal of an IGBT.

A variable resistive element 190 is electrically connected in a controlled path CP between the first load electrode 310 and the drift zone 121 such that the variable resistive element 190 activates and deactivates an electronic element of the semiconductor device 500 in response to a change of the operational state of the semiconductor device 500.

The controlled path CP may include further active or passive electronic elements, for example resistive paths, pn junctions, Schottky contacts, ohmic contacts or bipolar transistors that may be electrically connected in series with the variable resistive element 190. Alternatively or in addition, further active or passive electronic elements may be electrically connected in parallel with the variable resistive element 190.

FIG. 1A refers to an embodiment with the variable resistive element 190 electrically connected in a controlled path CP between the drift zone 121 and a first load electrode 310, wherein further active or passive electronic elements may be electrically arranged in series with the variable resistive element 190 in the controllable path. For example, a semiconductor diode may be arranged between the drift zone 121 and the variable resistive element 190. The functionality of the variable resistive element 190 and the further electronic elements in the controlled path CP may be based on different structures. According to other embodiments, the variable resistive element 190 and the further electronic elements in the controlled path CP may share one or more common structures.

FIG. 1B refers to an embodiment with the variable resistive element 190 electrically arranged in a controlled path CP between the drift zone 121 and the second load electrode 320.

The variable resistive element 190 may include a varistor structure which resistance value is a function of the applied voltage. According to another embodiment, the variable resistive element 190 is a resistive switching structure the resistance of which switches between a low-resistance state and a high-resistance state under the influence of a strong electric field or current, wherein the change of resistance is non-volatile and reversible. For example, the resistive switching structure is a MEMristor.

The variable resistive element 190 may change its resistance value to a significant degree, for example by a ratio of at least 10:1 or at least 50:1, when an electric field or voltage drop across the variable resistive element 190 or a current through the variable resistive element 190 exceeds or falls below a predetermined threshold. The threshold may be crossed when the semiconductor device 500 changes its operational state, for example when a load condition of the semiconductor device 500 significantly changes, e.g. when entering or leaving a short circuit operational mode, an operational avalanche mode, when changing between a forward and reverse biased operational mode or between blocking and conducting operational modes.

By temporarily bypassing or blocking active or passive electronic elements formed in the semiconductor body 100, the variable resistive element 190 allows for improving the device characteristics for one operational state without adversely affecting other operational states.

The variable resistive element 190 may be formed from structures exclusively dedicated to the respective variable resistive element 190 or may include one or more structures dedicated to a further functional structure in the semiconductor device 500.

Figure 2A:
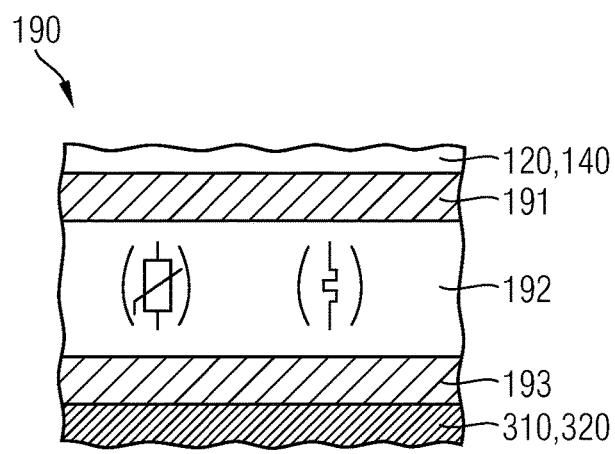
FIG. 2A is a schematic cross-sectional view of a portion of a variable resistive element with two discrete element electrodes in accordance with an embodiment.

In FIG. 2A the variable resistive element 190 includes a first element electrode 191 and a second element electrode 193 sandwiching an element matrix 192. The first element electrode 191 may directly adjoin the drift and rear side structure 120 or the emitter region 140. The second element electrode 193 may directly adjoin the first load electrode 310 or the second load electrode 320.

The first and second element electrodes 191, 193 may be conductive metal electrodes. The element matrix 192 may be, by way of example, a ceramic mass of zinc oxide grains in a matrix of other metal oxides in case the variable resistive element 190 is based on a varistor structure.

According to embodiments based on resistive switching cells, the first and second element electrodes 191, 193 may be selected from metals and conductive metal compounds such as platinum (Pt), tungsten (W), iridium (Ir), titanium nitride (TiN), tantalum (Ta), nickel (Ni), copper (Cu), gold (Au) and titanium oxynitride (TiON). According to another embodiment, the first and second element electrodes 191, 193 are based on semiconducting materials such as heavily doped crystalline or polycrystalline silicon. The element matrix 192 may be based on nickel oxide (NiO), titanium oxide (TiO), hafnium oxide (HfO), zirconium oxide (ZrO), tungsten oxide (WO), alumina ($Al_2O_3$), zinc oxide (ZnO) or silicon oxide (SiO).

According to an embodiment, the variable resistive element 190 is based on a resistive switching cell with silicon-containing element electrodes 191, 193 and a silicon oxide based element matrix 192.

Figure 2B:
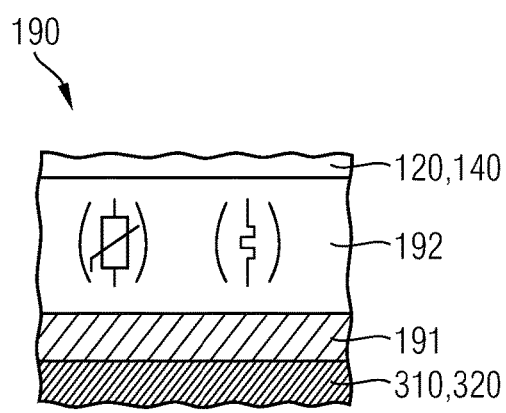
FIG. 2B is a schematic vertical cross-sectional view of a variable resistive element with one discrete element electrode directly adjoining a load electrode according to another embodiment.

FIG. 2B refers to an embodiment with the first element electrode 191 formed by a portion of the drift and rear side structure 120 or the emitter region 140.

Figure 2C:
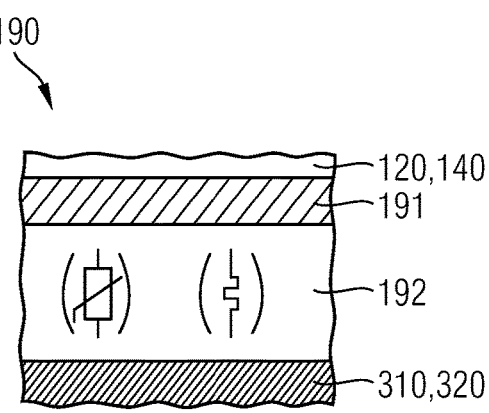
FIG. 2C is a schematic vertical cross-sectional view of a variable resistive element with one discrete element electrode directly adjoining a drift zone or an emitter region according to a further embodiment.

In FIG. 2C one of the first or second load electrodes 310, 320 is effective as the second element electrode.

Figure 2D:
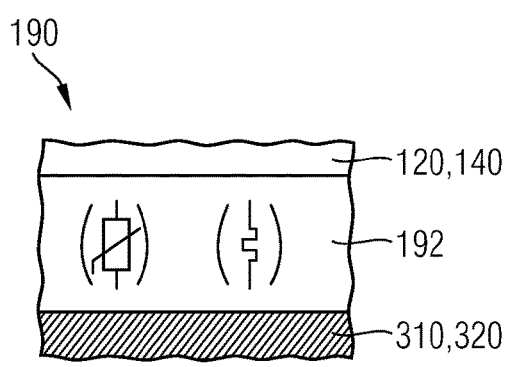
FIG. 2D is a schematic vertical cross-sectional view of a variable resistive element with no discrete element electrodes according to a further embodiment.

In FIG. 2D the drift and rear side structure 120 or the emitter region 140 is effective as one of the element electrodes and one of the first and second load electrodes 310, 320 is effective as the other element electrode such that the element matrix 192 is sandwiched between the drift and rear side structure 120 or the emitter region 140 on a first side and one of the first and second load electrodes 310, 320 on an opposite second side.

Figure 3A:
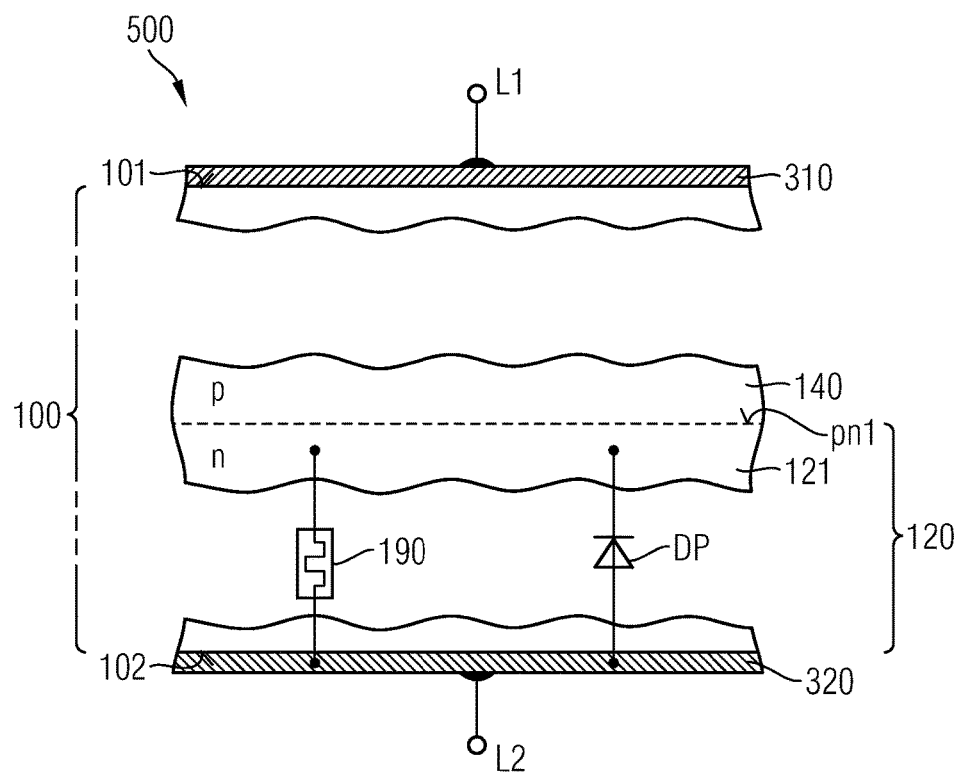
FIG. 3A is a simplified schematic cross-sectional view of a portion of a semiconductor device in accordance with an embodiment concerning a variable resistive element connected in parallel with a diode between a drift zone and a second load electrode.
Figure 3B:
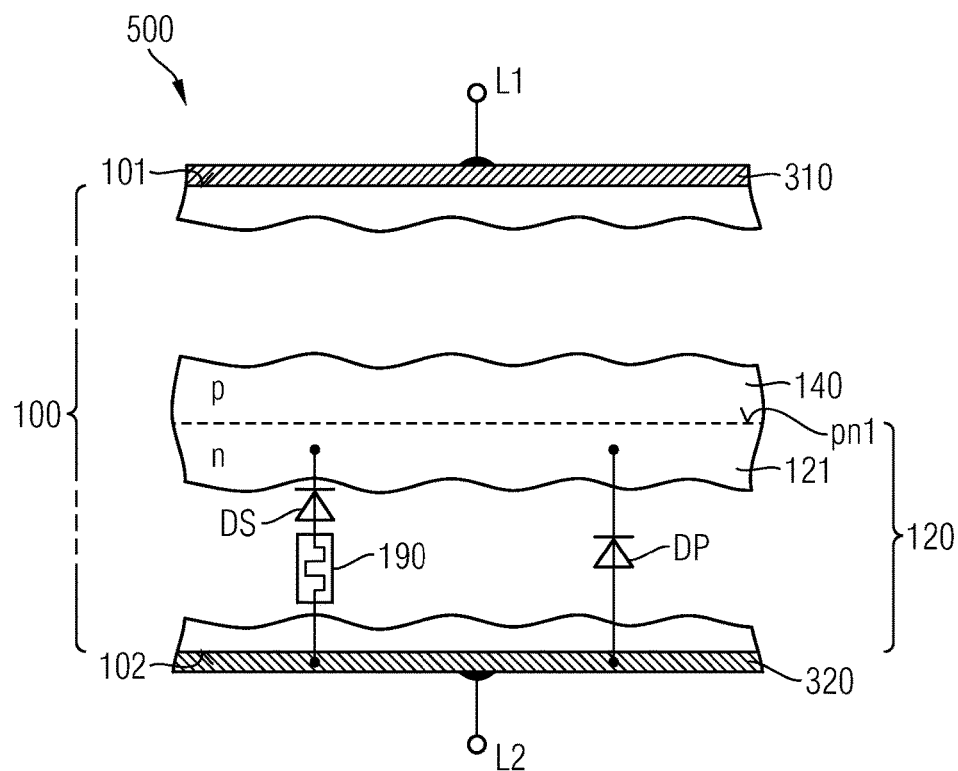
FIG. 3B is a simplified vertical cross-sectional view of a portion of a semiconductor device in accordance with an embodiment concerning a variable resistive element connected in series with a diode in a controlled path between a drift zone and a second load electrode.
Figure 3C:
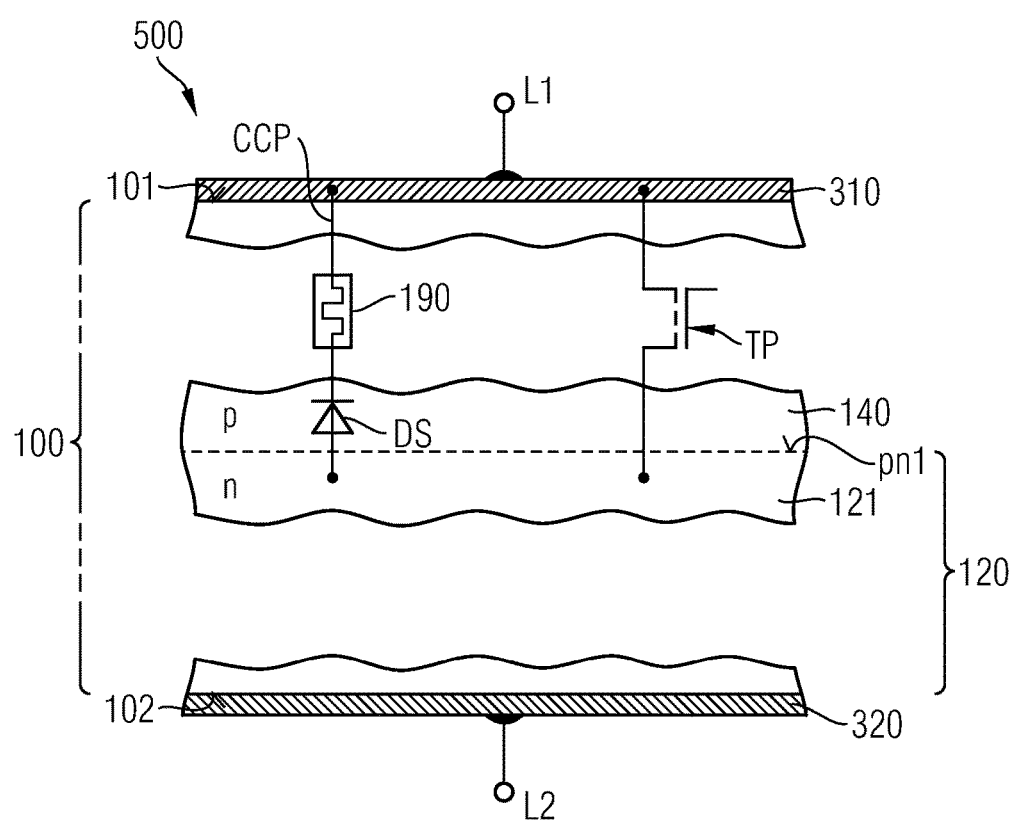
FIG. 3C is a simplified vertical cross-sectional view of a portion of a semiconductor device in accordance with an embodiment concerning a variable resistive element connected in series with a diode in a controlled path between a first load electrode and a drift zone.
Figure 5A:
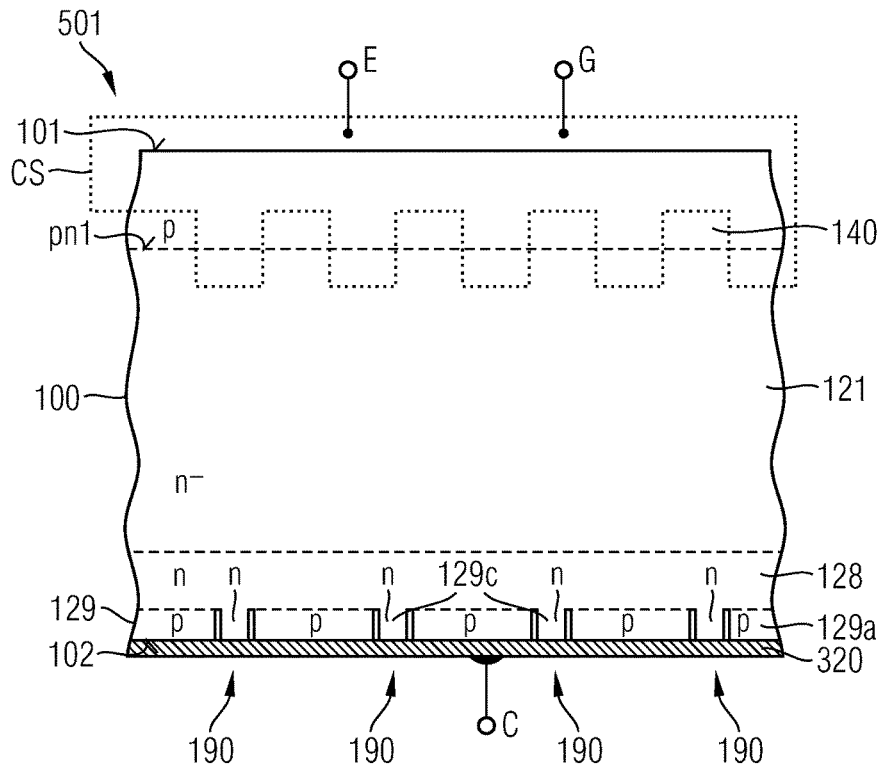
FIG. 5A is a schematic cross-sectional view of a portion of an IGBT according to an embodiment with self-controlling shorts based on variable resistive elements connected between a second load electrode and a drift structure including a drift zone.
Figure 5B:
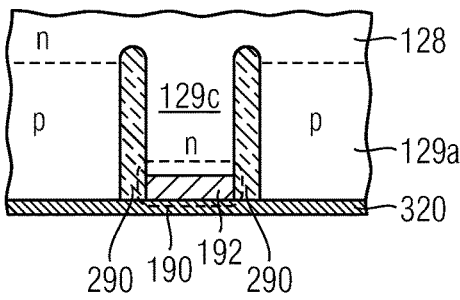
FIG. 5B shows details of the variable resistive elements of FIG. 5A according to an embodiment concerning an element matrix arranged along the concerned load electrode.
Figure 5C:
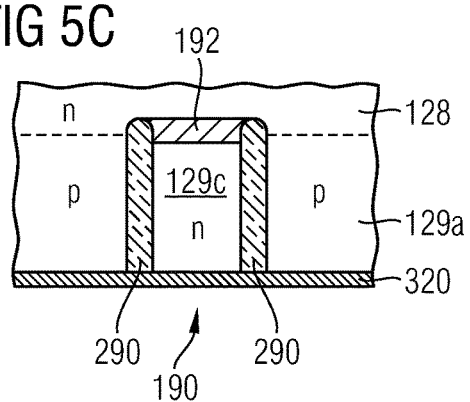
FIG. 5C shows details of the variable resistive elements of FIG. 5A according to an embodiment concerning an element matrix formed along the drift structure.
Figure 5D:
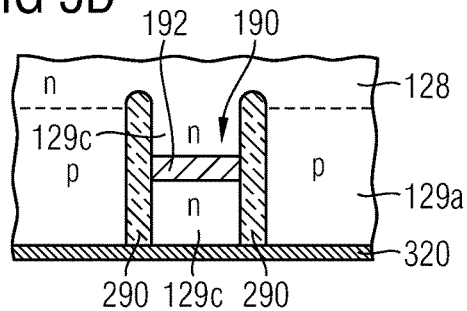
FIG. 5D shows details of the variable resistive element of FIG. 5A according to an embodiment concerning an element matrix spaced from both the drift structure and the concerned load electrode.

FIGS. 3A to 3C concern embodiments with variable resistive elements 190 bypassing or blocking electronic elements such as diode structures DP, DS or IGFET (insulated gate field effect transistor) cells TP in a semiconductor device 500 during and/or shortly after a current overload condition.

In FIG. 3A the variable resistive element 190 is electrically connected between a drift zone 121 and the second load electrode 320. The variable resistive element 190 is electrically connected in parallel with a parallel diode structure DP. The parallel diode structure DP may be, e.g., the pn-junction between a p-emitter and a drift region of an IGBT. In a first operational state, the variable resistive element 190 may have a high-resistance state such that the parallel diode structure DP is active and mainly affects the function of the drift and rear side structure 120.

For example, the variable resistive element 190 may have a high resistance state in a normal operational mode of the semiconductor device 500. When an overload condition occurs, the variable resistive element 190 takes a low impedance state and bypasses to some degree the parallel diode structure DP. In case the diode structure DP is a sufficiently strong emitter that injects a sufficient number of charge carriers, the diode structure DP still supports the operation during the overload condition despite the active shorts formed by the variable resistive elements 190 in their low-resistance state. When the semiconductor device 500 returns from the overload condition back to the normal operational mode, the variable resistive elements 190 remain active for an inherent response time, which may be at least 100 µs, for example at least 1 ms. During the response time, the active shorts divert a hot-leakage current induced by the thermal stress caused by the overcurrent in the semiconductor body 100 and in this way reduce the bipolar amplification of the hot-leakage current. At the end of the response time, the resistive element 190 switches back to the high-resistance state and does not adversely affect the normal operational mode of the semiconductor device 500.

FIG. 3B refers to a semiconductor device 500 with different first and second diode structures DP, DS connected in parallel between the drift zone 121 and the second load electrode 320. Variable resistive elements 190 are electrically connected in series with the second diode structure DS. The first and second diode structures DP, DS may differ with regard to hole emitter efficiency.

In a high impedance state of the variable resistive element 190, the second diode structures DS are blocked and are not effective as hole emitters. As long as the resistive elements 190 are in a high-impedance state, only the first diode structures DP emit holes in a respective operational mode of the semiconductor device 500. A short-circuit event may trigger a low-impedance state of the resistive elements 190 thereby activating the second diode structures DS as hole emitters. The overall hole emitter efficiency increases and prevents development of a negative field gradient in the drift and rear side structure 120. By avoiding a negative field gradient, a negative impact of such negative field gradient on device stability can be avoided, such that a higher ruggedness against over current destruction can be achieved. A detection circuit may detect the short circuit condition and switches off the load current. As the electric field across the variable resistive elements 190 diminishes, the variable resistive elements 190 return into the high-resistance state and the overall effective hole emitter efficiency is reduced to the initial value.

In FIG. 3C the variable resistive elements 190 may be connected in series with second diode structures DS in controlled paths CP, which are electrically parallel to IGFET cells TP between the drift zone 121 and the first load electrode 310.

Switching on and off the variable resistive elements 190 may improve the dissipation of holes from the drift zone 121 to the first load electrode 310 in a short circuit or current overload condition. The parallel path may alternatively decrease a voltage drop across the parallel MOS-channel of the IGFET cells and thereby reduce the current flowing parallel through the semiconductor body 100 during a short circuit condition. As a result, the semiconductor body 100 heats up to a lower temperature in the same time. When the semiconductor device 500 returns from the current overload condition, the high temperature in the semiconductor body 100, which is due to the current overload condition, cures the variable resistive elements 190.

FIGS. 4A to 4C refer to an IGBT 501 with variable resistive elements 190 temporarily increasing the hole emitter efficiency of a collector structure 129 at a rear side of the IGBT 501 in case of a current overload condition.

The IGBT 501 is based on a semiconductor body 100 as described in detail with regard to FIGS. 1A to 1B. The semiconductor body 100 includes a drift and rear side structure 120 oriented to the rear side and directly adjoining the second surface 102. The drift and rear side structure 120 includes a drift zone 121 of the first conductivity type and is spaced from the second surface 102.

An emitter region 140 of the second conductivity type is formed between the first surface 101 and the drift and rear side structure 120 and forms a first pn junction pn1 with the drift zone 121. Portions of the emitter region 140, the drift zone 121 and further doped regions, insulator structures and highly-conductive structures form a control section CS electrically connected and/or coupled to an emitter terminal E and a gate terminal G of the IGBT 501. The control section CS electrically connects the emitter terminal E with the emitter region 140 when a potential applied at the gate terminal G exceeds/falls below a predetermined threshold and vice versa. According to an embodiment, the control section CS includes IGFET cells with source and body zones electrically connected to the emitter terminal E, with gate electrodes electrically connected to the gate terminal G, and with portions of the emitter region 140 being effective as drain zones of the IGFET cells. The IGFET cells may be lateral IGFET cells with the gate electrodes formed outside the outline of the semiconductor body 100 or may be vertical IGFET cells with the gate electrodes formed in gate trenches extending from the first surface 101 into the semiconductor body 100. The control section CS may include further structures such as floating doped regions, barrier layers and/or field electrodes, wherein the field electrodes may be electrically connected to the emitter terminal E.

The drift and rear side structure 120 may include a collector structure 129 directly adjoining the second surface 102 as well as a buffer or field stop layer 128 of the first conductivity type separating the drift zone 121 from the collector structure 129. A mean dopant concentration in the field stop layer 128 may be at least five times as high as the mean dopant concentration in the drift zone 121. The collector structure 129 includes lightly doped first sections 129a of the second conductivity type. The first sections 129a form pn junctions with the field stop layer 128 or the drift zone 121. Along the second surface 102, the maximum dopant concentration in the first sections 129a is sufficiently high to ensure an ohmic contact with the metal forming the second load electrode 320. A maximum dopant concentration in the first sections 129a is between 1E16 and 1E18 $cm^{-3}$.

The collector structure 129 further includes more heavily doped second sections 129b as well as variable resistive elements 190 temporarily connecting the second sections 129b with the second load electrode 320, the field stop layer 128, or, in absence of a contiguous field stop layer 128, with the drift zone 121. The heavily doped second sections 129b in combination with the resistive elements 190 may have a greater vertical extension than the lightly doped first sections 129a.

Auxiliary dielectrics 290 separate the heavily doped second sections 129b from the lightly doped first sections 129a. The auxiliary dielectrics 290 may include at least one of a silicon nitride, silicon oxide, silicon oxynitride, by way of example. A ratio of the maximum dopant concentration in the second sections 129b to the maximum dopant concentration in the first sections 129a may be in a range from 3:1 to 500:1, e.g., in a range from 10:1 to 100:1.

As illustrated in FIG. 4B, the variable resistive element 190 may be arranged between the second load electrode 320 and the heavily doped second section 129b.

In FIG. 4C, the variable resistive element 190 is arranged between the field stop layer 128 and the heavily doped second section 129b.

In FIG. 4D sections of the heavily doped second sections 129b separate the variable resistive element 190 from both the field stop layer 128 and the second load electrode 320. The variable resistive element 190 is sandwiched between two sections of the heavily doped second sections 129b of the collector structure 129.

The variable resistive element 190 may have any of the configurations described in more detail with respect to FIGS. 2A to 2D. According to the illustrated embodiments the variable resistive element 190 includes an element matrix 192 based on silicon oxide and the adjoining portions of the field stop layer 128, the second sections 129b, and/or the second load electrode 320 are effective as element electrodes.

In the embodiments of FIGS. 4A to 4D, the collector structure 129 is effective as a self-adapting or "intelligent" hole emitter with low hole-emitter efficiency in a normal operation mode and high hole-emitter efficiency during a short circuit or current-overload condition. In the normal operation mode the variable resistive element 190 is in a high resistance state such that the heavily doped second sections 129b of the collector structure 129 are disabled and electrically inactive. The dopant concentration/areal dose of the first sections 129a of the collector structure 129 is comparatively low such that in a conductive mode of the IGBT 501 a charge carrier plasma density in the drift zone 121 is low and the dynamic losses during turn-off are low.

In case of a short circuit or overcurrent incident, a high current flows through the semiconductor body 100 in the vertical direction resulting in a significant voltage drop across the high-ohmic element matrix 192. When the voltage drop exceeds a set voltage of the variable resistive element 190 the resistance of the variable resistive element 190 gets significantly reduced, e.g., to less than 1% of the resistance in the high-resistance state. The heavily doped second sections 129b of the collector structure 129 get enabled and become electrically active. The total hole emitter efficiency of the collector structure 129 drastically increases thereby preventing development of a negative field gradient in a portion of the drift and rear side structure 120 oriented to the second surface 102, and in this way contributes to higher short circuit ruggedness.

When the IGBT 501 recovers from the short-circuit condition after switching off the short-circuit current, the collector structure 129 is free of high electric fields. The semiconductor body 100 is still heated up to a temperature above at least 200° C., for example at least 300° C. The thermal energy immanent in the semiconductor body 100 directly after recovering from the short circuit condition, in the absence of an electric field, resets the variable resistive element 190, which may be based on resistive switching element.

Resistive switching elements such as MEMristors include element matrices 192 based, e.g., on a silicon oxide ($SiO_x$) matrix. Under the short circuit condition the effective electric field orders oxygen vacancies in the $SiO_x$ matrix to contiguous filaments between the element electrodes resulting in paths with an increased portion of silicon atoms compared to oxygen atoms. When the electric field dissipates, a thermally induced diffusion of the oxygen vacancies dissolves the filaments and the resistive switching element resumes the high-resistance state.

The collector structure 129 returns to a state with low hole emitter efficiency resulting in low switching losses. The collector structure 129 of the IGBT 501 illustrated in FIGS. 5A to 5D includes counter-doped third sections 129c of the conductivity type of the drift zone 121. As regards further details, reference is made to the description of FIGS. 4A to 4D.

The variable resistive elements 190 in combination with the counter-doped third sections 129c are effective as self-controlling or "intelligent" shorts between the drift zone 121 or the field stop layer 128 on the one side and the second load electrode 320 at the opposite side.

In a normal operation mode the variable resistive elements 190 are in a high-resistance state such that the shorts are disabled. In case of an overcurrent condition, for example in a short-circuit event, a voltage drop across the collector structure 129 sets the variable resistive elements 190 which assume a low-impedance state. The shorts get enabled and become active such that the low impedance path through the shorts electrically connect the field stop layer 128 or, in absence of the field stop layer 128, the drift zone 121 to the second load electrode 320. The variable resistive elements 190 exhibit a defined response time to the extinction of the electric field. Thereby the response time is defined by the time until conductive filaments in the element matrix 192 of a resistive switching element have been thermally dissolved. During the response time, the shorts divert a hot leakage current induced by the previous overcurrent condition such that a bipolar amplification of the hot leakage current is significantly reduced. In this way, the active shorts increase the robustness of the IGBT 501 against thermal destruction incidents.

The remaining thermal energy in the semiconductor body 100 dissolves the current filaments in the element matrix 192, wherein the shorts get automatically disabled and become inactive. The reverse blocking capability of the IGBT 501 is fully restored. The disabled counter-doped third sections 129c affect the hole emitter efficiency only during and shortly after the overload incident and are inactive in the normal operation mode. In contrast to self-confining micro-shorts without variable resistive elements aiming at a similar effect, the dimensions of the counter-doped third sections 129c are less critical.

The bypass structures including the variable resistive elements 190 and the counter-doped third sections 129c as illustrated in FIGS. 5A to 5D can be combined with the intelligent emitter regions of FIGS. 4A to 4D in the same IGBT 501.

The IGBT 501 of FIG. 6A is based on the IGBT 501 as described with reference to FIGS. 4A to 4D. In addition, FIG. 6A shows details of the control section CS in accordance with an embodiment based on trench gate structures 150 and field electrode structures 160.

The control section CS may include IGFET cells TC as well as idle cells IC. The IGFET cells TC are assigned to gate structures 150 formed at the front side with the first surface 101. The gate structures 150 may be stripes extending in a direction orthogonal to the cross-sectional area or may have dot-shaped horizontal cross-sections. According to an embodiment, a horizontal cross-section of a gate structure 150 is an oval, a circle or a regular or distorted polygon, for example a square, a hexagon or an octagon. According to other embodiments, the gate structure 150 forms a grid which meshes form ovals, circles or regular or distorted polygons with or without rounded or beveled corners. The gate structures 150 include a gate electrode 155 including or consisting of a heavily doped polycrystalline silicon layer and/or a metal-containing layer.

A gate dielectric 151 may completely insulate the gate electrode 155 against the semiconductor body 100. The gate dielectric 151 capacitively couples the gate electrode 155 to portions of the semiconductor body 100. The gate dielectric 151 may include or consists of a semiconductor oxide, for example thermally grown or deposited silicon oxide, silicon nitride, for example thermally grown or deposited silicon nitride, a semiconductor oxynitride, for example silicon oxynitride or a combination thereof.

The gate structures 150 may be lateral gates formed outside the semiconductor body 100 along the first surface 101. According to the illustrated embodiment the gate structures 150 are trench gates extending from the first surface 101 into the semiconductor body 100 down to at least the drift zone 121.

The gate electrode 155 is electrically connected or coupled to the gate terminal G of the IGBT 501.

The idle cells IC are based on field electrode structures 160 that may extend from the first surface 101 down to at least the drift zone 121. According to an embodiment, the gate structures 150 and the field electrode structures 160 may have the same vertical extension and/or the same width. The field electrode structures 160 may be stripes extending in a direction orthogonal to the cross-sectional plane or may be needle-shaped, wherein the horizontal cross-sections may be ovals, circles or distorted or regular polygons with or without rounded corners such as squares, hexagons or octagons. According to an embodiment, a field electrode structure 160 may surround a gate structure 150 in all horizontal directions or vice versa. Each field electrode structure 160 includes a field electrode 165 and a field dielectric 161 surrounding the field electrode 165 and separating the field electrode 165 from the semiconductor body 100.

The field electrode 165 includes or consists of a heavily doped polycrystalline silicon layer and/or a metal-containing layer. The field dielectric 161 may include or consist of a thermally grown silicon oxide layer. According to an embodiment, the field dielectric 161 may include or consist of a deposited silicon oxide layer, e.g. a silicon oxide layer based on TEOS (tetraethyl orthosilicate).

The field electrode 165 and the gate electrode 155 may be formed from the same material(s). The field dielectric 161 may be thicker than the gate dielectric 151. The field electrodes 165 may be electrically connected to the emitter terminal E, to an additional control terminal, to an output of a driver circuit integrated in the same semiconductor body 100 or may float. The ratio of a population density of field electrodes 160 to a population density of gate electrodes 150 may be between 1:1 and 10:1. In the illustrated embodiment, the ratio of the population densities of field electrodes 160 to gate electrodes 150 in the cross-sectional plane is 4:1, wherein four field electrode structures 160 are formed between each pair of neighboring gate structures 150.

Portions of the semiconductor body 100 between neighboring gate electrode structures 150 or between neighboring gate and field electrode structures 150, 160 form active mesas 170a. Each active mesa 170a includes a body zone 115a of the second conductivity type and forming a first pn junction pn1 with the drift zone 121 as well as at least one source zone 110 forming a second pn junction pn2 with the body zone 115a. The body zones 115a separate the source zones 110 from the drift zone 121. The gate dielectrics 151 capacitively couple the gate electrode 155 to a channel portion of the adjoining body zone 115a.

Portions of the semiconductor body 100 between neighboring field electrode structures 160 form passive mesas 170b. The passive mesas 170b may include idle doped zones 115b forming further first pn junctions pn1 with the drift zone 121.

In the illustrated embodiments and for the following description, the first conductivity type is n-type and the second conductivity type is p-type. Similar considerations as outlined below apply also to embodiments with the first conductivity type being p-type and the second conductivity type being n-type.

When a voltage applied to the gate electrodes 155 exceeds a preset threshold voltage, electrons accumulate in the channel portions directly adjoining the gate dielectrics 151 and form inversion channels short-circuiting the first pn junctions pn1 for electrons.

An interlayer dielectric 210 adjoining the first surface 101 may electrically insulate the gate electrode 155 from the first load electrode 310 arranged at the front side. In addition, the interlayer dielectric 210 may be formed in the vertical projection of the field electrode structures 160.

The interlayer dielectric 210 may include one or more dielectric layers from silicon oxide, silicon nitride, silicon oxynitride, doped or not doped silicate glass, for example BSG (boron silicate glass), PSG (phosphorus silicate glass) or BPSG (boron phosphorus silicate glass), by way of example.

The first load electrode 310 may form or may be electrically coupled or connected to the emitter terminal E. The second load electrode 320, which directly adjoins the second surface 102 and the collector structure 129, may form or may be electrically connected to the collector terminal C.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a silicide, a nitride and/or an alloy.

Contact structures 315 extend through openings in the interlayer dielectric 210 and electrically connect the first load electrode 310 with the source zones 110 and, through intermediate heavily doped contact zones 116, with the body zones 115a. The contact structures 315 further electrically connect the first load electrode 310 with the field electrodes 165 of the transistor cells TC. The contact structures 315 may include one or more conductive metal containing layers based on, e.g., titanium (Ti) or tantalum (Ta) and a metal fill portion, e.g., based on tungsten (W). According to other embodiments the contact structures 315, include heavily doped semiconductor structures, e.g., heavily n-doped polycrystalline structures or heavily p-doped columnar single crystalline structures.

Figure 6B:
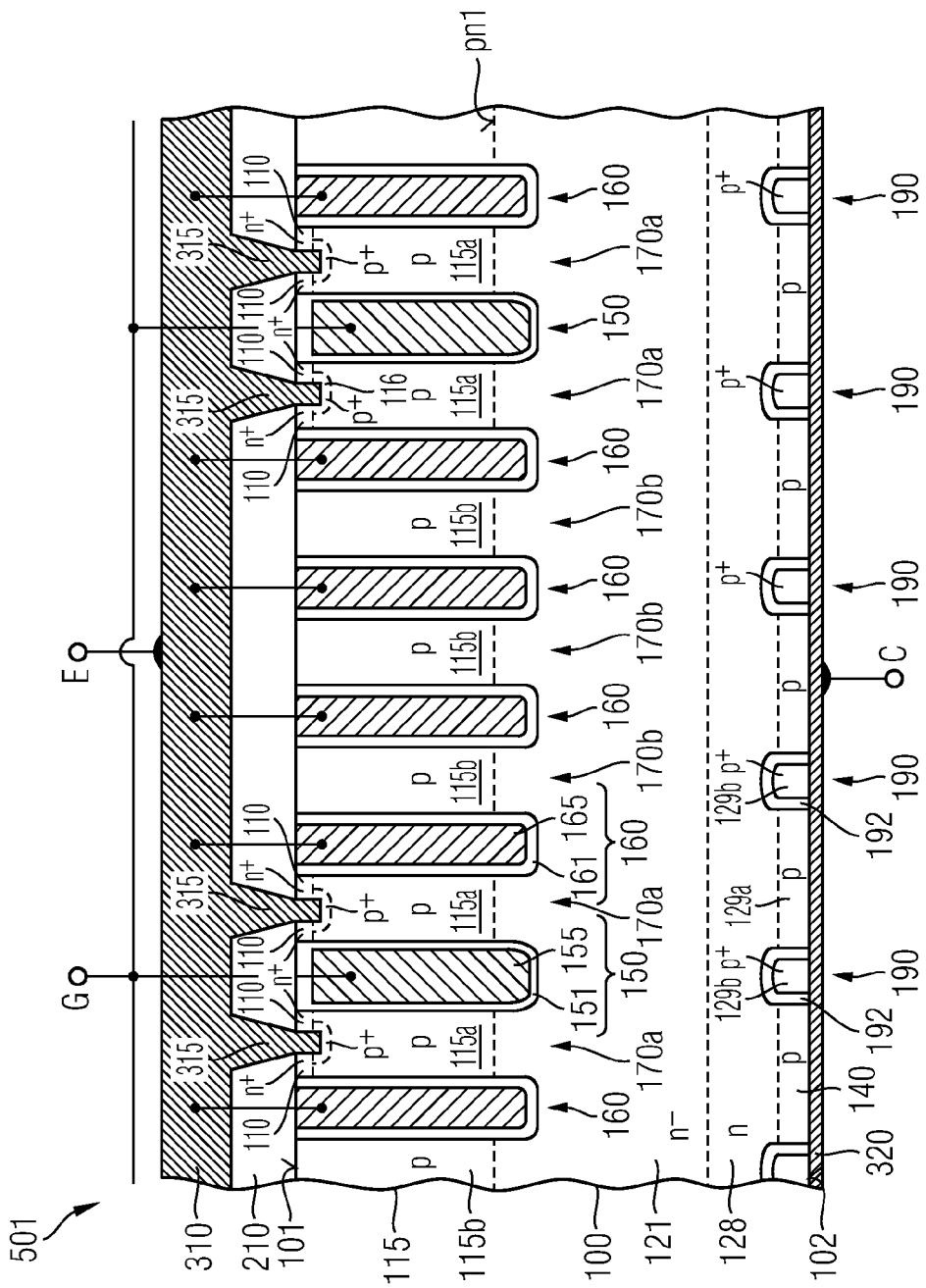
FIG. 6B is a schematic vertical cross-sectional view of a portion of an IGBT according to an embodiment concerning controllable charge carrier emitters at a rear side and an element matrix with horizontal and vertical portions.

The IGBT 501 of FIG. 6B includes variable resistive elements 190 with an element matrix 192 completely encapsulating the heavily-doped second sections 129b of the collector structure 129 against the lightly doped first sections 129a and the field stop layer 128, or, in absence of the field stop layer 128, the drift zone 121. The element matrix 192 may be formed by lining a trench etched into the second surface 102 from the rear side.

Figure 6C:
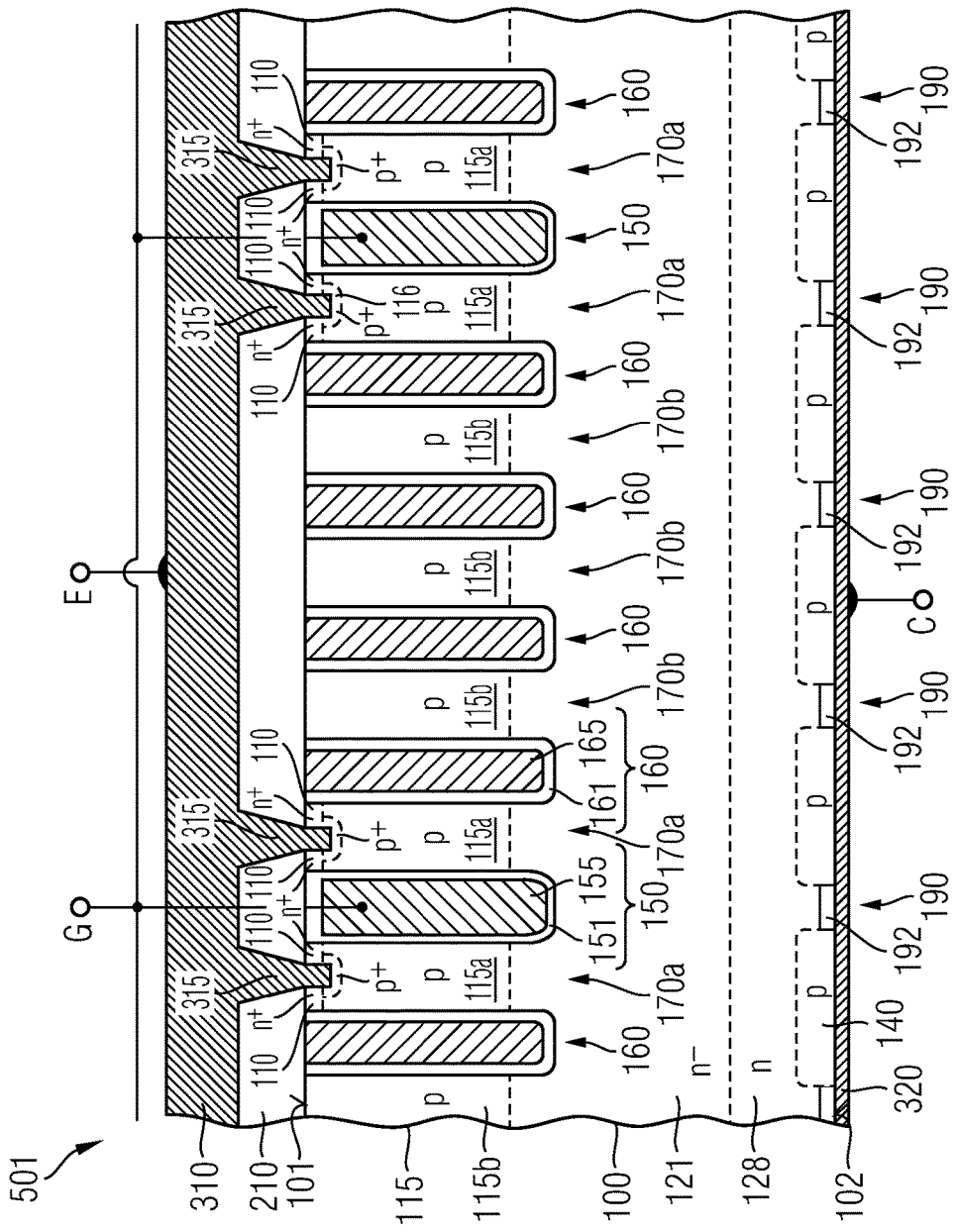
FIG. 6C is a schematic vertical cross-sectional view of a portion of an IGBT according to an embodiment concerning self-controlling shorts at a rear side.

FIG. 6C combines the control section CS as described in detail with reference to FIG. 6A with self-controlling shorts as described in detail with regard to FIGS. 5A to 5D.

Figure 6D:
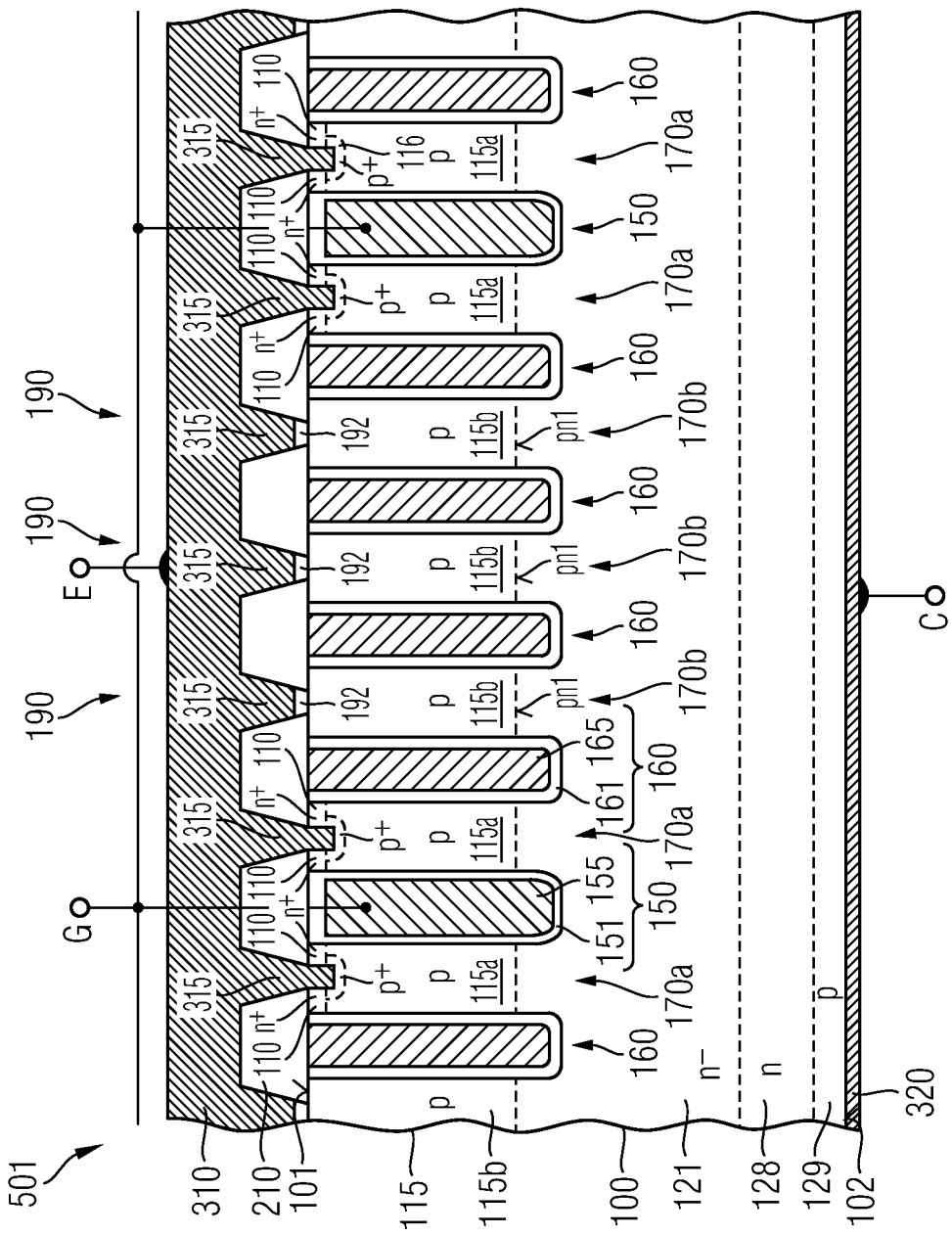
FIG. 6D is a schematic vertical cross-sectional view of a portion of an IGBT according to an embodiment concerning self-controlling shorts along a first load electrode at a front side.
Figure 6E:
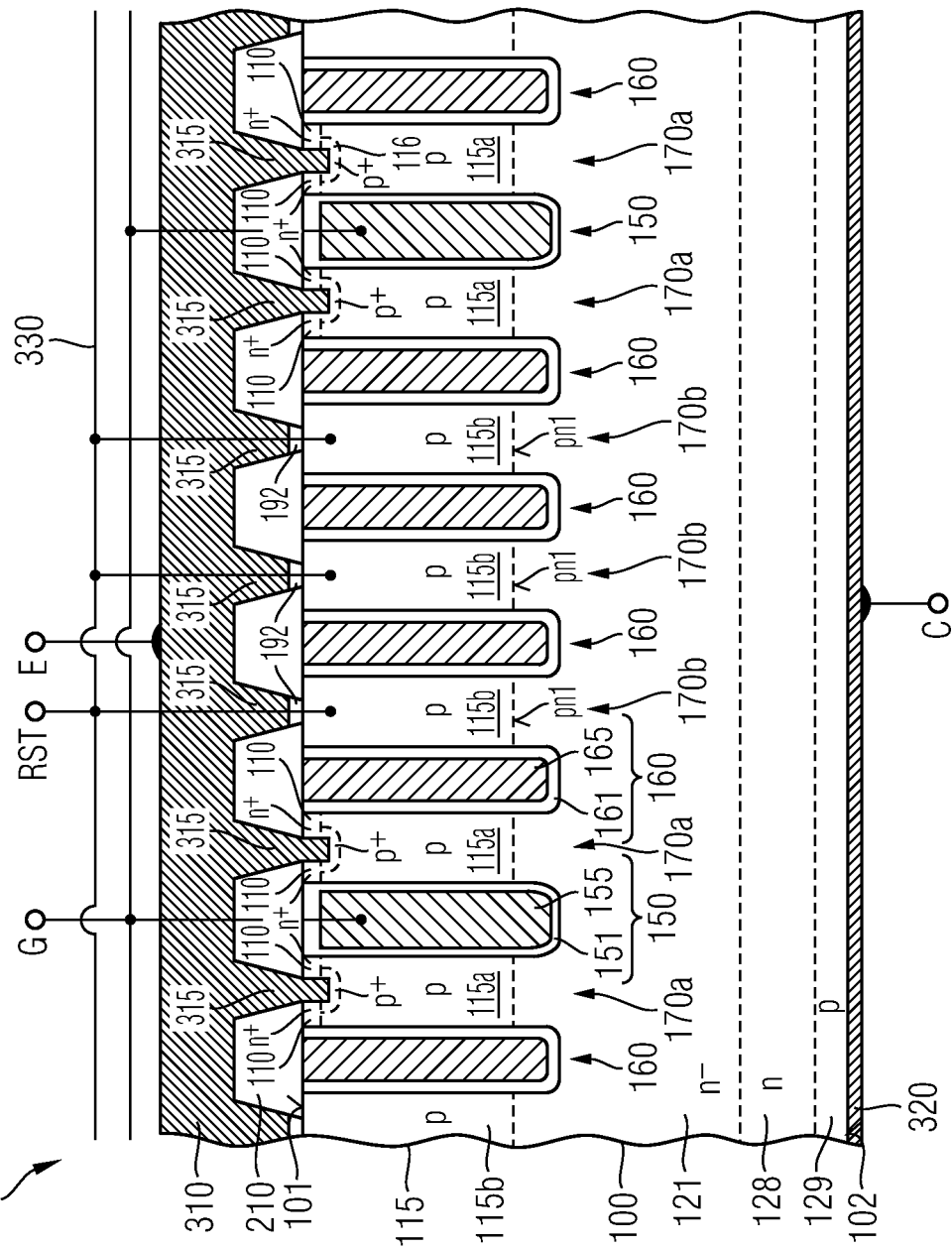
FIG. 6E is a schematic vertical cross-sectional view of a portion of an IGBT according to an embodiment concerning self-controlling and resettable shorts at a front side.
Figure 6F:
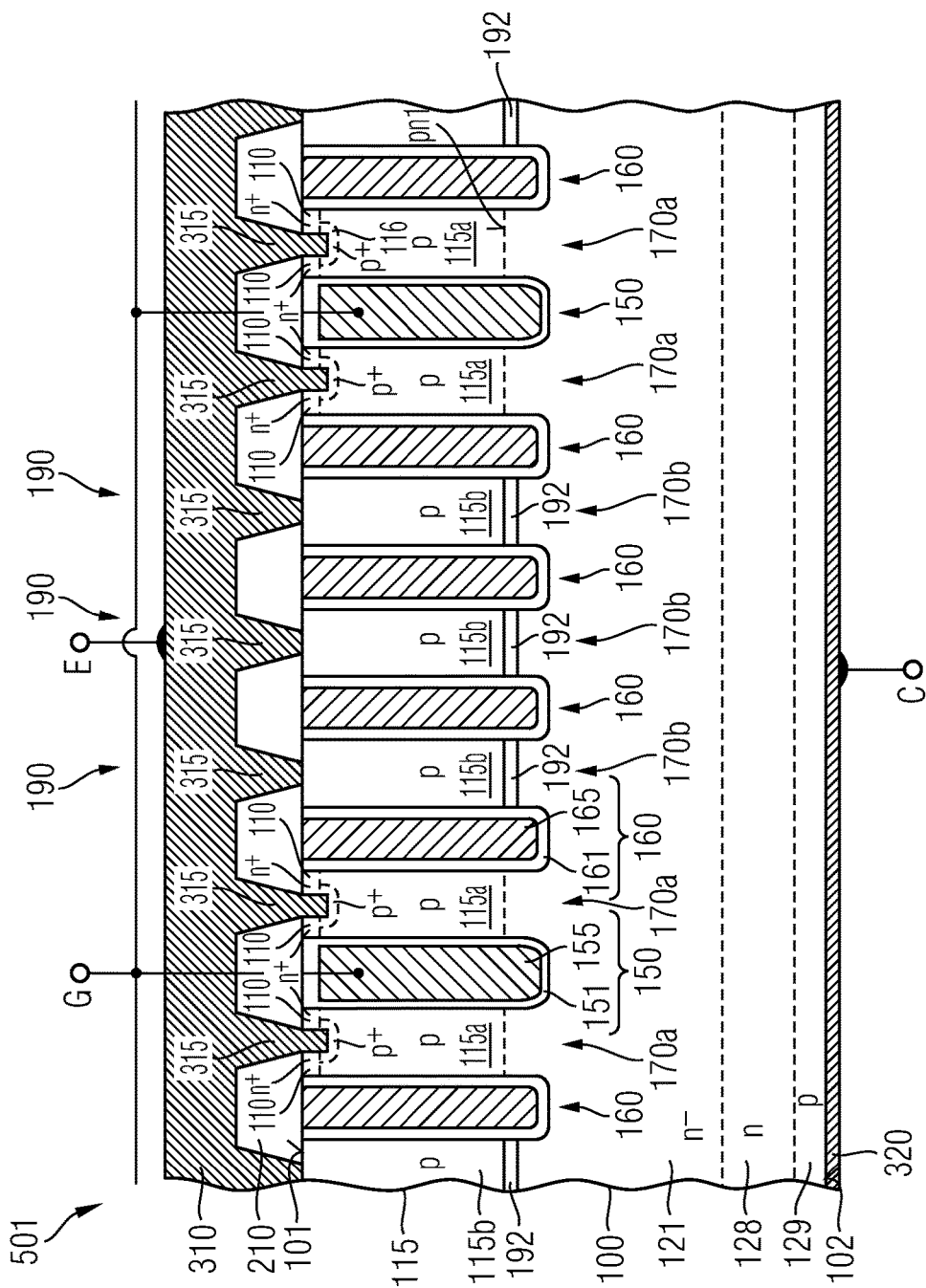
FIG. 6F is a schematic vertical cross-sectional view of a portion of an IGBT according to an embodiment concerning self-controlling shorts along a drift zone at a front side.

FIGS. 6D, 6E, and 6F combine the control section CS as described with regard to FIG. 6A with self-controlling shorts at a front side as described in detail with regard to FIG. 3C. Variable resistive elements 190 including at least a matrix element 192 are formed between the contact structures 315 extending from the first load electrode 310 through openings in the interlayer dielectric 210 at the one side and the idle doped zones 115b at the other side.

In a normal operation mode, the variable resistive elements 190 are in a high-resistance state and the idle doped zones 115b in at least some of the passive mesas 170b are disabled and electrically inactive. During an overload condition, for example, if a short-circuit condition occurs, a high voltage drops across the variable resistive elements 190 and the idle doped zones 115b on the front side. When the voltage drop exceeds a set voltage of the variable resistive elements 190 the variable resistive elements 190 turn into a low-resistance state, wherein a ratio between the high-resistance value and the low-resistance value is at least 50:1. The idle doped regions 115b get electrically connected to the first load electrode 310. Holes diverted from the drift zone 121 are drained off by the first load electrode 310 also through the additional bypasses such that a voltage drop induced by the holes in the semiconductor body 100 is reduced. The bypasses realized by the variable resistive elements 190 reduce the power losses in the semiconductor body and the semiconductor body 100 heats up at a lower rate. As a consequence, the variable resistive elements 190 improve overload robustness of the IGBT 501.

In the illustrated embodiment, the collector structure 129 is a contiguous layer. According to other embodiments, the variable resistive elements 190 at the front side may be combined with the self-controlling emitters and/or the self-controlling shorts at the rear side as illustrated in the previous figures.

Typically, an auxiliary circuit outside the IGBT 501 or integrated in the semiconductor body 100 detects the overload condition and interrupts the load circuit such that the IGBT 501 can recover from the overload condition. In the absence of an electric field no voltage drops across the variable resistive elements 190 such that thermal energy stored in the semiconductor body 100 during the overcurrent condition can reset the variable resistive elements 190. As a consequence, the idle doped zones 115b do not adversely affect the normal operation mode of the IGBT 501.

Alternatively or in addition, the variable resistive elements 190 may use a voltage drop occurring during a Miller phase of the turn-off to switch into a low resistive state. In this case, the additional path for holes allows a faster and more efficient recover of the IGBT 501 from the conductive mode.

According to the embodiment illustrated in FIG. 6D, an external gate driver unit may trigger the variable resistive element 190 to switch into the low-resistance state prior to turning off the IGBT 501, for example by providing a gate-voltage between a nominal on-state voltage and a threshold voltage. After turning-off, the IGBT 501 is in a blocking state with the first pn junctions pn1 between the idle doped zones 115 and the drift region reverse biased. The variable resistive elements 190 become field free and recover to the high-resistance state due to the thermal energy stored in the semiconductor body 100.

The IGBT 501 of FIG. 6E includes a reset line 330 electrically connected to the idle doped zones 115b. The reset line 330 may be electrically connected to a reset terminal RST or to an output of an internal driver circuit integrated in the semiconductor body 100 and applying a reset signal to the reset line 330. The reset line 330 may be used for supporting the reset of the variable resistive elements 190.

FIG. 6F refers to an embodiment with the variable resistive element 190 arranged between the idle doped zones 115b in the passive mesas 170 at one side and the drift zone 121 at the opposite side. According to a further embodiment, the element matrix 192 may separate a first and a second section of the respective idle doped zone 115b according to the pattern illustrated in FIGS. 4D and 5D.

Figure 7A:
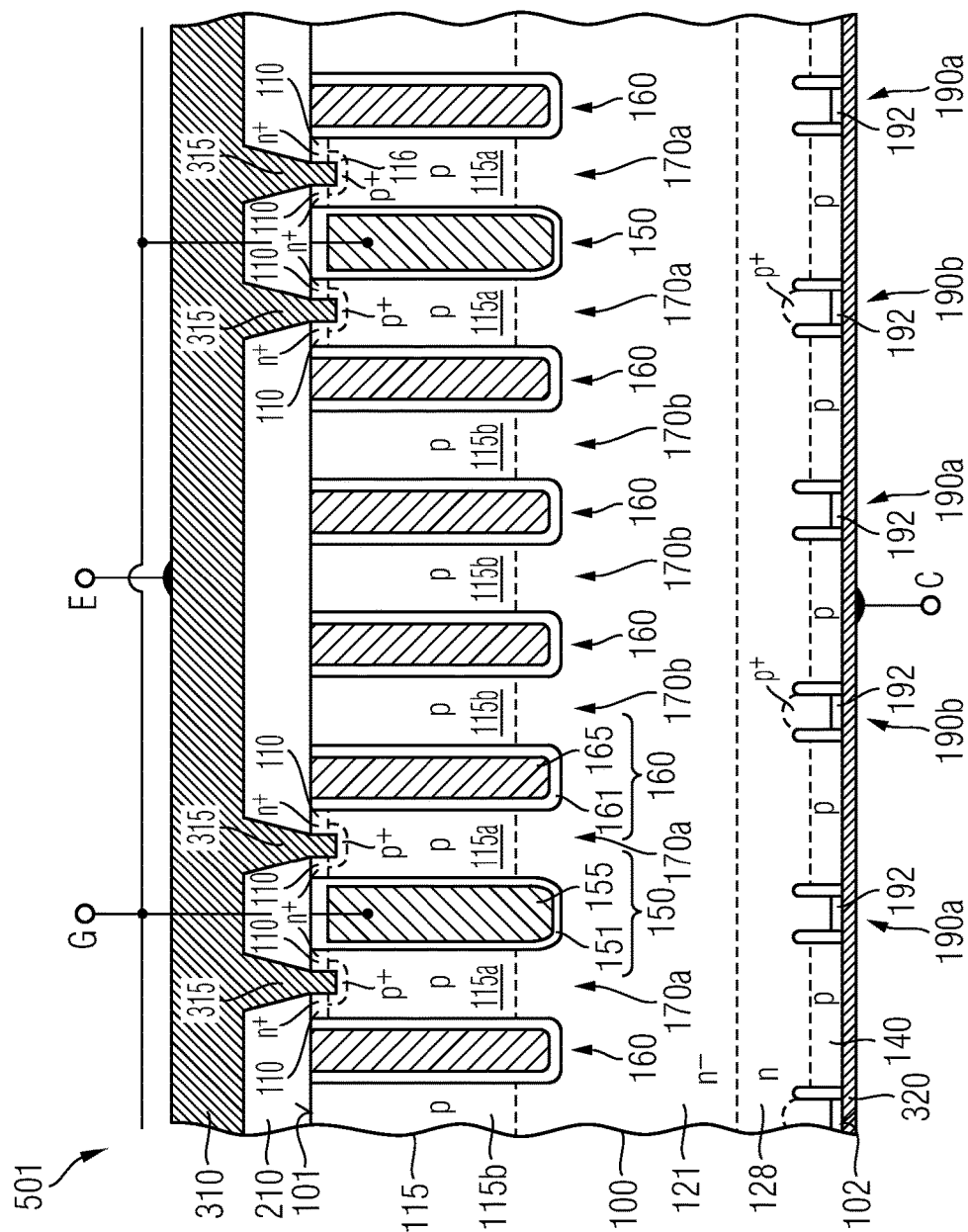
FIG. 7A is a schematic vertical cross-sectional view of a portion of an IGBT according to an embodiment combining self-controlling shorts and a self-adapting charge carrier emitter at a rear side.

FIG. 7A combines self-controlling emitters 190b and self-controlling shorts 190a in the same collector structure 129. The self-controlling emitters and shorts 190b, 190a may be provided at a ratio between 1:100 and 100:1, for example in a range from 1:10 to 10:1. In the illustrated embodiment, the ratio of self-controlling shorts 190a to self-controlling emitters 190b is about 1:1. The self-controlling shorts 190a and/or the self-controlling emitters 190b may be stripes extending in a direction orthogonal to the cross-sectional plane or may be dot-shaped with a first horizontal extension at most 5 times as large as a second horizontal extension orthogonal to the first horizontal extension.

Figure 7B:
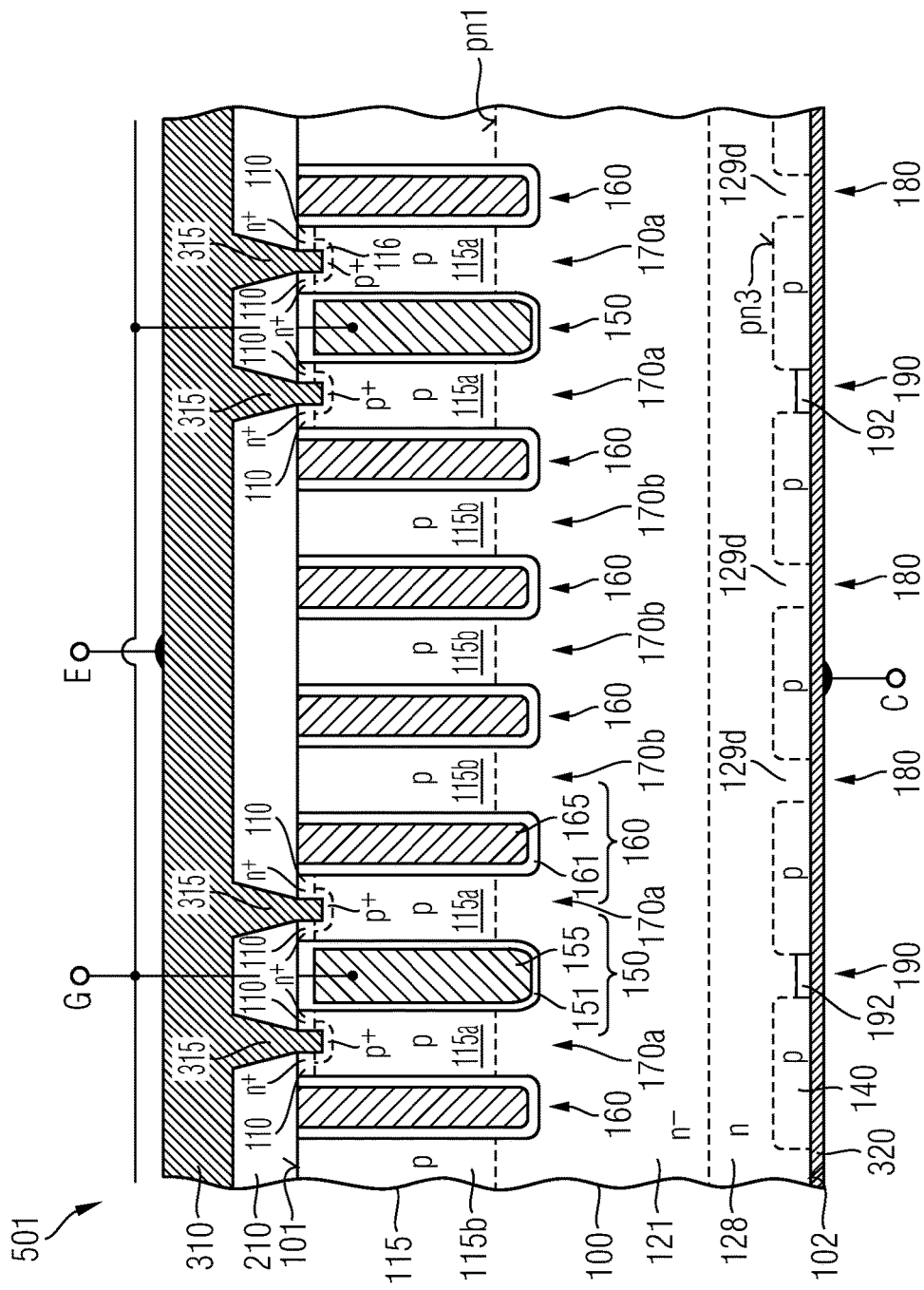
FIG. 7B is a schematic vertical cross-sectional view of a portion of an IGBT according to an embodiment combining self-controlling shorts and self-confining shorts.

The collector structure 129 of the IGBT 501 in FIG. 7B includes self-controlling shorts based on variable resistive elements 190 as well as self-confining shorts 180 based on lightly counter-doped fourth sections 129d of the collector structure 129. In a reverse blocking state, depletion regions extending along the opposite vertical sidewalls of the counter-doped fourth sections 129d merge with each other such that the fourth sections 129d are fully depleted and bar charge carriers from passing through the self-confined shorts.

Figure 8:
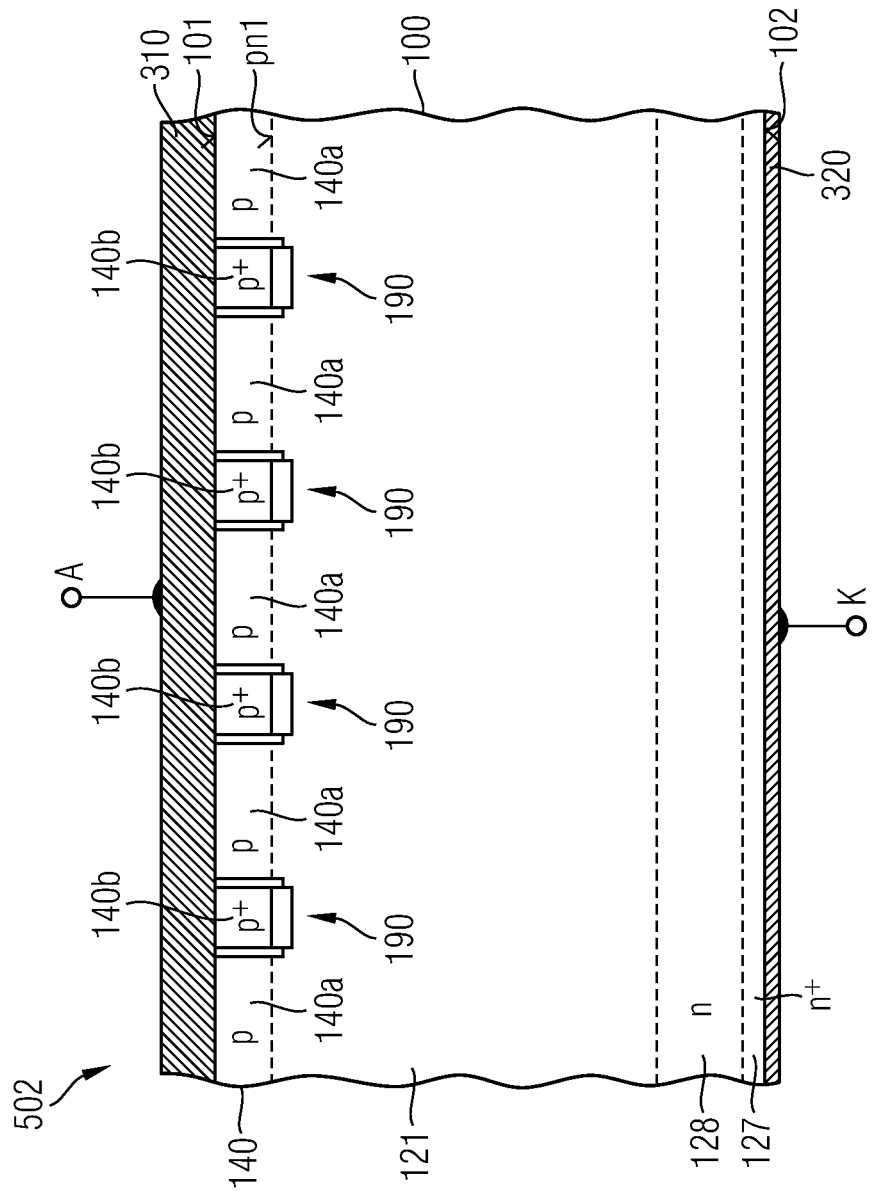
FIG. 8 is a schematic vertical cross-sectional view of a portion of a power semiconductor diode according to a further embodiment.

FIG. 8 illustrates a power semiconductor diode 502. The emitter region 140 includes first sections 140a and second sections 140b extending between the first load electrode 310 and the drift zone 121, respectively. A mean dopant concentration in the second sections 140b is at least three times as high as a mean dopant concentration in the first sections 140a. The variable resistive elements 190 are electrically connected in series with the second sections 140b. In case of an overcurrent event, the variable resistive elements 190 change from a high-resistance state to a low-resistance state thereby activating the second sections 140b. The resulting higher number of injected charge carriers lowers the voltage drop across the semiconductor body 100 and reduces the speed at which the semiconductor body 100 heats up such that the power semiconductor diode 502 can be specified for higher overload currents and/or longer short-circuit times. In normal operational mode the variable resistive elements 190 block the second sections 140b such that a dense charge carrier plasma resulting in low static losses can be obtained in the conductive state. The variable resistive elements 190 may be placed between the second sections 140b and the drift zone 121, or may be placed between the second sections 140b and the first load electrode 310.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body comprising a drift zone forming a pn junction with an emitter region;
a first load electrode at a front side of the semiconductor body;
a second load electrode at a rear side of the semiconductor body opposite to the front side; and
one or more variable resistive elements electrically connected in a controlled path between the drift zone and one of the first and second load electrodes.

2. The semiconductor device of claim 1, wherein the variable resistive element is a varistor.

3. The semiconductor device of claim 1, wherein the variable resistive element is a resistive switching element.

4. The semiconductor device of claim 1, wherein the variable resistive element is configured to change from a high-ohmic state to a low-ohmic state in response to a change of a load condition of the semiconductor device.

5. The semiconductor device of claim 1, wherein the variable resistive element is configured to change from a high-ohmic state to a low-ohmic state in case a short-circuit condition occurs in the semiconductor body.

6. The semiconductor device of claim 1, wherein the variable resistive element is configured to change from a high-ohmic state to a low-ohmic state in case an avalanche breakdown occurs in the semiconductor body or the semiconductor device changes from a conductive state to a blocking state.

7. The semiconductor device of claim 1, wherein the variable resistive element includes an element matrix based on silicon and oxide.

8. The semiconductor device of claim 1, further comprising a collector structure in the semiconductor body between the drift zone and the second load electrode, wherein the collector structure comprises at least first sections of a conductivity type opposite to a conductivity type of the drift zone.

9. The semiconductor device of claim 8, wherein the variable resistive elements are electrically connected in a controlled path electrically connected in parallel with the first sections.

10. The semiconductor device of claim 8, wherein the collector structure includes second sections of the conductivity type of the first sections, wherein a mean dopant concentration in the second sections is at least three times as high as a mean dopant concentration in the first sections and the variable resistive elements are electrically connected in series with the second sections.

11. The semiconductor device of claim 10, further comprising auxiliary dielectrics separating the first and second sections.

12. The semiconductor device of claim 8, wherein the collector structure includes third sections of the conductivity type of the drift zone and the variable resistive elements are electrically connected in series with the third sections.

13. The semiconductor device of claim 8, wherein the collector structure includes self-confining shorts configured to be fully depleted in a reverse blocking state.

14. The semiconductor device of claim 8, wherein the emitter region comprises idle doped zones forming pn junctions with the drift zone and the variable resistive elements are electrically connected in a controlled path electrically connected in series with the pn junctions.

15. The semiconductor device of claim 14, wherein the variable resistive elements are electrically connected between the first load electrode and the idle doped zones.

16. The semiconductor device of claim 14, wherein the variable resistive elements are electrically connected between the idle doped zones and the drift zone.

17. The semiconductor device of claim 14, further comprising a reset line electrically connecting the idle doped zones with a reset terminal.

18. The semiconductor device of claim 1, wherein the emitter region includes first sections and second sections extending between the first load electrode and the drift zone, respectively, wherein a mean dopant concentration in the second sections is at least three times as high as a mean dopant concentration in the first sections and the variable resistive elements are electrically connected in series with the second sections.

19. The semiconductor device of claim 18, further comprising auxiliary dielectrics separating the first and second sections.

20. An insulated gate bipolar transistor, comprising:
a semiconductor body comprising a drift zone forming a pn junction with an emitter region;
a first load electrode at a front side of the semiconductor body;
a second load electrode at a rear side of the semiconductor body opposite to the front side; and
one or more variable resistive elements electrically connected in a controlled path between the drift zone and one of the first and second load electrodes.

* * * * *